United States Patent
Aflenzer et al.

(10) Patent No.: US 6,643,142 B2
(45) Date of Patent: Nov. 4, 2003

(54) MODULE HAVING A LEAD FRAME EQUIPPED WITH COMPONENTS ON BOTH SIDES

(75) Inventors: Gunter Aflenzer, Unterpremstatten (AT); Joachim Heinz Schober, Graz (AT); Marcus Toth, Gratkorn (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/973,317

(22) Filed: Oct. 9, 2001

(65) Prior Publication Data

US 2002/0075663 A1 Jun. 20, 2002

(30) Foreign Application Priority Data

Oct. 11, 2000 (EP) .............................................. 00890308

(51) Int. Cl.[7] ................................................. H05K 7/18
(52) U.S. Cl. ...................... 361/813; 361/761; 361/723; 361/779; 257/686; 174/259
(58) Field of Search ................................. 361/813, 763, 361/765, 768, 772, 830, 715, 718, 723, 760, 779; 174/259, 52.4; 257/723, 686, 779, 778

(56) References Cited

U.S. PATENT DOCUMENTS

| | | | |
|---|---|---|---|
| 4,928,387 A | * 5/1990 | Mather et al. ............... | 174/263 |
| 4,999,742 A | 3/1991 | Stampfli ...................... | 361/400 |
| 5,532,910 A | * 7/1996 | Suzuki et al. ............... | 174/52.4 |
| 5,583,372 A | * 12/1996 | King et al. .................. | 257/668 |
| 5,859,759 A | * 1/1999 | Moriyama et al. ............. | 338/42 |
| 5,864,062 A | * 1/1999 | Nagahara et al. ......... | 73/514.01 |
| 6,005,778 A | * 12/1999 | Spielberger et al. ......... | 257/686 |
| 6,087,718 A | * 7/2000 | Cho ........................... | 257/686 |
| 6,313,998 B1 | * 11/2001 | Kledzik et al. ............. | 257/686 |
| 6,316,822 B1 | * 11/2001 | Venkateshwaran et al. . | 257/666 |

* cited by examiner

*Primary Examiner*—David Martin
*Assistant Examiner*—Hung Bui
(74) *Attorney, Agent, or Firm*—Steven R. Biren

(57) ABSTRACT

A module (1) for contactless communication includes a plurality of electrical components (4, 5, 6, 7, 8) which each have at least two contact faces (9, 10, 11, 12, 13, 14, 15, 16) for the electrical connection. The electrical components (4, 5, 6, 7, 8) of the module are mounted both on a component side (MB) and an on adhesive side (MK) of a lead frame (M) formed by metal strips (MS). During the manufacture of the module (1) the metal strips (MS) of the lead frame (M) are held in one plane (E) and in position by means of an adhesive tape (K). The adhesive tape (K) has openings (A1, A2, A3, A4, A5, A6) at given positions of the lead frame (M) so as to enable electrical components to be mounted on the adhesive side (MK) of the lead frame (M).

9 Claims, 1 Drawing Sheet

MODULE HAVING A LEAD FRAME EQUIPPED WITH COMPONENTS ON BOTH SIDES

BACKGROUND AND SUMMARY OF THE INVENTION

The invention relates to a module for contactless communication with a transmitting/receiving station, which module has at least two electrical components which each have at least two contact faces for the electrical connection, an adhesive tape being used in the manufacture of the module.

The invention further relates to a key for deactivating the anti-theft device of a lock, which key has a housing which accommodates a module of the type defined in the opening paragraph.

Such a module of the type defined in the opening paragraph is known from the document U.S. Pat. No. 4,999,742 and is adapted to provide contactless communication with a transmitting/receiving station. The known module has an integrated circuit with two contact faces, two metal strips and a timing transmitting/receiving coil, molded into a synthetic resin housing.

During the fabrication of the module an adhesive tape is used to immobilize these electrical components in one plane. To this end, the electrical components are first positioned onto the adhesive tape and electrically connected by means of bonding wires. Subsequently, the part of the module which is already electrically operable is molded into a synthetic resin in order to provide the mechanical strength of the module. With the known module it has proved to be a disadvantage that the electrical components of the module are all arranged side by side, which is why the module has a comparatively large surface area. As a result of this, the housing of the known key, which includes this known module, is unfortunately comparatively large.

It is an object of the invention to provide a module whose surface area can be reduced by a more effective arrangement of the electrical components, so as to enable it to be also accommodated in, for example, a small housing of a key. In order to achieve this object such a module has characteristic features in accordance with the invention are provided in an apparatus in accordance with the invention, in such a manner that the module can be characterized in the manner defined hereinafter.

A module for contactless communication with a transmitting/receiving station, which module has at least two electrical components which each have at least two contact faces for the electrical connection, and which has a lead frame which is formed by at least two metal strips which are separated from each other both mechanically and electrically and which have a component side, for mounting at least one of the electrical components, and which have an adhesive side and which during the manufacture of the module are held in substantially one plane by means of adhesive tape applied to the adhesive sides of the metal strips, in which the adhesive tape has openings for the contact faces of at least one of the electrical components so as to enable at least one of the electrical components to be mounted on the metal strips from the adhesive side.

Thus, it is achieved that the metal strips can be contacted at both sides through openings in the adhesive tape and that the metal strips can be provided with components on both sides. This has the advantage that the surface area of the module can be reduced substantially, as a result of which the housing of the module is also very small. This small module is then particularly suitable for incorporation in, for example, a car key, key fob or a hotel room key or for attachment to an article.

It is to be noted that providing both sides of a board with components is known since long. Such boards are made of an electrically non-conductive material, as for example epoxy resin, having copper layers on both sides. However, the fabrication of such boards equipped with electrical components on both sides is very expensive because first of all the conductor tracks (metal strips) should be formed from the copper layer, for example by means of an etching process, on both sides of the board. Subsequently, a hole is to be drilled in board for each through-connection and subsequently the edges of the holes must be plated-through in order to ensure the electrical interconnection.

The lead frame provided with components on both sides in accordance with the invention has the advantage that the conductor tracks on the second side are dispensed with because both the electrical components arranged on the component side and those arranged on the adhesive side are in contact with the metal strips which extend essentially in one plane. As a result of this, the module can be fabricated at substantially lower cost and the elimination of the comparatively thick epoxy resin layer and the second layer of conductor tracks enables the overall height of the module to be reduced, which is very advantageous.

The measures as defined in claim 2 have the advantage that the module can be employed for a multitude of additional possible uses requiring contact-bound communication with the module. It is then particularly advantageous that the correct operation of the contactless communication part of the module can also be tested via the module contact faces of the contact-bound communication part of the module. This enables standard test equipment to be used in the fabrication of the module, which has the advantage that both the costs for testing and the time for testing the module can be reduced.

The measures as defined in claim 3 have the advantage that the module contact faces arranged on only two opposed lateral surfaces can be formed substantially simpler and, consequently, cheaper in a punching process. In addition, the advantage is obtained that the module having only two module contact faces on opposed lateral surfaces can be transferred in a storage rail and can be fed to a placement machine at the end of the storage rail. By contrast, modules having module contact faces on three or four lateral surfaces of the module have to be transferred in trays and have to be taken out of the tray individually by a placement machine, which has disadvantages both during the transport of the modules and during mounting of components on the modules.

The measures as defined in claim 4 have the advantage that the surface area of the module including the module contact faces is smaller than in the case of S-shaped module contact faces. U-shaped module contact faces have the additional advantage that the likelihood of the module contact faces being bent during transport and during incorporation of the module is substantially smaller than in the case of S-shaped module contact faces.

The measures of claim 5 have the advantage that the surface area of the module is particularly small and that a simple connection of the integrated circuit to the transmitting/receiving coil is possible.

By means of a punching process the lead frame for the module can be manufactured particularly cost-effectively.

According to the invention, in order to achieve the object mentioned hereinbefore, such a key includes a module as defined in claim 1. This has the advantage that the housing of the key can be comparatively small, which is highly appreciated by users of said key.

The aforementioned aspects as well as further aspects of the invention will be apparent from the example of an embodiment described hereinafter and will be elucidated with the aid of this example.

The invention will be described in more detail hereinafter with reference to an embodiment which is given by way of example but to which the invention is not limited.

DESCRIPTION OF THE PREFERRED EMBODIMENT

Figure 1:
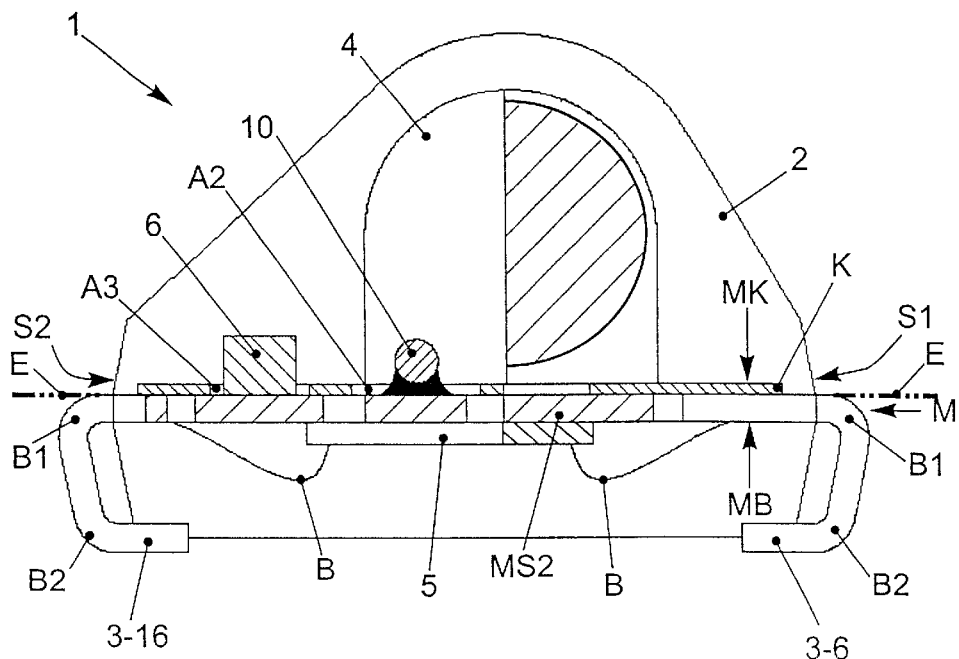
FIG. 1 is a sectional view A–D of a module for the contactless communication with a transmitting/receiving station, which module has a lead frame equipped with electrical components on both sides.
Figure 2:
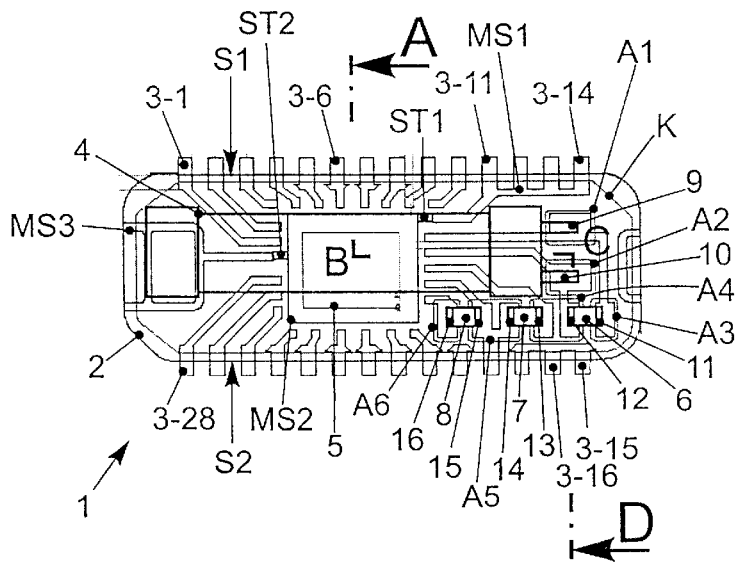
FIG. 2 is a diagrammatic plan view of the module shown in FIG. 1.

FIG. 1 is a sectional view A–D of a module 1, which is shown in a diagrammatic plan view in FIG. 2. The module 1 is intended for incorporation in the housing of a car key and together with a transmitting/receiving station provided in a car it forms an anti-theft device for the car. The module 1 is adapted to provide contactless communication with the transmitting/receiving station in the car via a high-frequency electromagnetic field having a frequency of 125 kHz.

The module 1 has a housing 2 from which the module contact faces 3-1 to 3-28 project. The module contact faces 3-1 to 3-14 project from a first lateral surface S1 of the housing 2 and the module contact faces 3-15 to 3-28 project from a second lateral surface S2 of the housing 2, which second lateral surface S2 lies opposite to the first lateral surface S1.

By means of the module contact faces 3 the module 1 is adapted to provide contact-bound communication and thus to receive at least switching information and to supply at least control information. From a sensor provided in the housing of the car key, for unlocking and locking the doors of the car, the module 1 receives the switching information via the module contact faces 3 provided for this purpose.

An infrared transmission device arranged in the housing of the car key is connected to another module contact face 3 of the module 1. When the lock/unlock information is received from the module 1 the infrared transmission device transmits the lock/unlock information to an in-car receiving station connected to the car locks of the car. Thus, the car key with the module 1 has the function of deactivating the anti-theft device of the car as well as the function unlocking and locking the car doors.

The module 1 includes a transmitting/receiving coil 4, an integrated circuit 5, a first capacitor 6, a second capacitor 7 and third capacitor 8. Each of these electrical components has at least two contact faces for the electrical contact with the electrical components. The transmitting/receiving coil 4 has two contact faces 9 and 10, the first capacitor 6 has two contact faces 11 and 12, the second capacitor 7 has two contact faces 13 and 14, and the third capacitor 8 has two contact faces 15 and 16. The integrated circuit 5 has a total of 25 contact faces, which are connected to the module contact faces 3-1 to 3-28 by means of bonding wires B in an electrically conductive manner.

The module 1 further includes a metal frame M formed by a plurality of metal strips MS which are both mechanically and electrically separated from one another. Such a metal frame is generally referred to as a lead frame among experts. The lead frame M has, for example, a metal strip MS1, which forms the contact faces 3-11 to 3-14 and extends into the housing 2 of the module 1, in order to enable the metal strip MS1 to be connected to one of the contact faces of the integrated circuit 5 via one of the bonding wires B. Another metal strip MS2 is not connected to any one of the module contact faces 3 and serves for mechanically securing the integrated circuit 5 during the manufacture of the module 1, as will be described in more detail hereinafter.

The lead frame M has a component side MB and an adhesive side MK. The integrated circuit 5 is mounted on the component side MB of the lead frame M. During the fabrication of the module 1 an adhesive tape is attached to the adhesive side MK of the lead frame M, as will be described in more detail hereinafter.

The adhesive tape K now has openings A1 to A6, so as to enable components to be mounted on the lead frame MS from the adhesive side MK. In the case of the module 1 the transmitting/receiving coil 4 as well as the capacitors 6, 7 and 8 are mounted on the adhesive side of the lead frame M.

This has the advantage that the surface area of the module 1 is essentially the area bounded by the periphery of the housing 2 of the module 1 in FIG. 2. Therefore, the module 1 is very suitable for incorporation into the small housing of the car key.

A particularly advantageous feature of the module 1 is then that the transmitting/receiving coil 4 and the integrated circuit 5 are arranged opposite one another on the lead frame M on the adhesive side MK and on the component side MB, respectively. As a result of this, the module 1 has a particularly small surface area. In addition, it enables the electrical connection between the transmitting/receiving coil 4 and the integrated circuit 5 to be made in a particularly easy manner.

The module contact faces 3, which are led out of the housing 2 of the module 1, have two bends B1 and B2 and are U-shaped. The second bend B2 towards the module 1 and not away from the module 1 has the advantage that the surface area of the module 1 is not increased by the module contact faces 3, as would be the case with module contact faces 3 which project from the module 1. The U-shaped module contact faces 3 have the additional advantage that the likelihood of the module contact faces 3 being bent during transport and during incorporation of the module 1 is substantially smaller than in the case of S-shaped module contact faces.

The provision of module contact faces 3 connected to the integrated circuit 5 has the advantage that the correct operation of the of the contactless communication part of the module 1 can also be tested via the module contact faces 3 of the contact-bound communication part of the module 1. This enables standard test equipment to be used during the fabrication of the module 1, which has the advantage that both the costs for testing and the time for testing the module 1 can be reduced.

The manufacturing process for manufacturing the module 1 will now be explained. In a first process step the metal strips MS of the lead frame M are punched out of a thin metal sheet having a thickness of 150 $\mu$m. The metal strip MS1 then still has a scrap bridge ST1 and a metal strip MS3 still has a scrap bridge ST2 to the metal strip MS2 in order to hold the metal strip MS2 in position.

In a second process step the adhesive tape K is applied to the metal strips MS. The adhesive tape K, on the one hand, maintains the positions of the individual metal strips MS with respect to each other and, on the other hand, it keeps the metal strips MS substantially in one plane E during the subsequent process steps. In the second process step the adhesive tape K already has the openings A1 to A6, which enable the electrical components to be mounted from the adhesive side MK.

The adhesive tape K has additional openings in the areas of the scrap bridges ST1 and ST2. In a third process step the scrap bridges ST1 and ST2 are punched out, as a result of which the metal strip MS2 no longer has an electrical connection to any one of the module contact faces 3.

In a fourth process step the integrated circuit 5 is stuck onto the metal strip MS2 and subsequently it is connected to the module contact faces 3 and other metal strips of the lead frame M by means of the bonding wires B in a bonding process. Mounting the integrated circuit 5 on the metal strip MS2, which is not connected to any one of the module contact faces 3 has the advantage that the contactless communication part of the module 1 is protected wholly and the contact-bound communication part of the module 1 is protected largely against environmental influences, such as for example moisture.

In a fifth process step the lead frame M is first reversed and subsequently the transmitting/receiving coil 4 and the capacitors 6, 7 and 8 are stuck onto the adhesive side MK of the lead frame M.

In a sixth process step, which is completed after curing of the adhesive, the contact faces of the transmitting/receiving coil 4 and of the capacitors 6, 7 and 8 are soldered to the metal strips MS of the lead frame M by means of a reflow solder process.

In a seventh process step the lead frame M is molded in a synthetic resin by means of an injection-molding process, in which the housing 2 of the module 1 is formed. Subsequently, the module contact faces 3 are bent into a U-shape as shown in FIG. 1. The finished modules 1 are accommodated in a storage rail for subsequent transport.

The method of manufacturing the module 1 described hereinbefore enables the module 1 to be manufactured in a particularly effective and low-cost manner. As a result of the provision of the module contact faces 3 on the two opposite lateral surfaces S1 and S2 the punching process in the first process step can substantially simpler and cheaper. In addition, the advantage is obtained that the module 1, which has module contact faces 3 on the two opposite lateral surfaces S1 and S2 only, can be transported in the storage rail. During production of the car key this storage rail can be connected directly to a placement machine so as to enable automatic mounting of components on the module 1. Conversely, modules having module contact faces on three or four lateral surfaces of the module have to be transported in trays and have to be taken out of the tray individually by a placement machine, which has disadvantages both during the transport of the modules and during mounting of components on the modules.

It is to be noted that the scrap bridges ST1 and ST2 could not be removed in the third process step. This is particularly advantageous when the integrated circuit 5 produces comparatively much heat, which should be removed from the integrated circuit 5 in order to prevent the integrated circuit 5 from being destroyed. In this case the metal strips MS1 and MS3 would then act as heat sinks for the removal of heat from the integrated circuit.

It is to be noted that providing a lead frame with components on both sides is particularly advantageous in the case of a module for contactless communication because in this way the module can be particularly small and the integrated circuit is protected against environmental influences. However, providing a lead frame with components on both sides may also be advantageous in other fields of application.

It is to be noted that the lead frame of a module in accordance with the invention can be punched from a metal sheet of 1 mm thickness but also from a metal sheet of only 20 µm thickness. The metal strips can also be manufactured by means of an etching process.

It is to be noted that module 1 may also be held with its module contact faces 3 against contact faces of a write/read station for contact-bound communication with the write/read station. During such a contact-bound communication it is possible, for example, to store data representative of amounts of money in a memory of the module.

It is to be noted that the car key may include a UHF transmission device instead of an infrared transmission device for transmitting the lock/unlock information.

What is claimed is:

1. A module (1) for contactless communication with a transmitting/receiving station, which module (1) has at least two electrical components (4, 5, 6, 7, 8) which each have at least two contact faces (9, 10, 11, 12, 13, 14, 15,16) for the electrical connection, said electrical components comprising a transmitting/receiving coil (4), an integrated circuit (5) and a plurality of capacitors (6, 7, 8) and which has a lead frame (M) which is formed by at least two metal strips (MS) which are isolated from each other both mechanically and electrically and which each have a component side (MB) for mounting at least one of the electrical components (4, 5, 6, 7, 8), and which each have an adhesive side (MK) for mounting at least another of the electrical components (4, 5, 6, 7, 8) and which are held in substantially one plane (E) by means of permanent, curable adhesive tape (K) applied to the adhesive sides (MK) of the metal strips (MS), in which the adhesive tape (K) has openings (A1, A2, A3, A4, A5, A6) through which the contact faces (9, 10, 11, 12, 13, 14, 15, 16) of at least one of the electrical components (4, 6, 7, 8) are fixedly mounted in electrical communication to the metal strips (MS) adhesive side (MK) and the curable adhesive is cured.

2. A module (1) as claimed in claim 1, in which module contact faces (3-1 3-28) are led out of a housing (2) of the module (1) so as to enable communication of the module (1) through electrical contact faces (3-1 . . . 3-28) thereof with a write/read station.

3. A module (1) as claimed in claim 2, in which the module contact faces (3-1 . . . 3-28) are led out of the housing (2) at two mutually opposite lateral surfaces (S1, S2) of the housing (2) of the module (1).

4. A module (1) as claimed in claim 2, in which the module contact faces (3-1 . . . 3-28) led out of the housing (2) of the module (1) are U-shaped.

5. A module (1) as claimed in claim 2, wherein said integrated circuit (5) is connected to a metal strip (MS) that is isolated from contact faces (3).

6. A module (1) as claimed in claim 1, in which one of the electrical components is formed by an integrated circuit (5) and a second one of the electrical components is formed by a transmitting/receiving coil (4), and in which the integrated circuit (5) and the transmitting/receiving coil (4) are arranged substantially opposite one another, on the component side (MB) against the metal strip (MS2) and on the adhesive side (MK) against the adhesive tape (K), respectively.

7. A module (1) as claimed in claim 1, in which the lead frame (M) has been manufactured by means of a punching process.

8. A key for enabling actuation of a lock, which key has a housing which accommodates a module (1) as claimed in claim 1.

9. A module (1) as claimed in claim 1, further comprising a synthetic resin housing (2) encapsulating said module (1) with portions of said contact faces (3) protruding therefrom.

* * * * *